United States Patent
Li et al.

(10) Patent No.: US 11,842,672 B1
(45) Date of Patent: Dec. 12, 2023

(54) DISPLAY DRIVING ARCHITECTURE, DISPLAY DRIVING METHOD, AND DISPLAY DEVICE

(71) Applicant: HKC CORPORATION LIMITED, Shenzhen (CN)

(72) Inventors: Jianlei Li, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/336,999

(22) Filed: Jun. 17, 2023

(30) Foreign Application Priority Data

Dec. 20, 2022 (CN) .......................... 202211637930.9

(51) Int. Cl.
  *G09G 3/20* (2006.01)
  *G09G 3/3233* (2016.01)
  *H01L 27/12* (2006.01)

(52) U.S. Cl.
  CPC ......... *G09G 3/2096* (2013.01); *G09G 3/2007* (2013.01); *G09G 3/3233* (2013.01); *H01L 27/124* (2013.01); *G09G 2300/0842* (2013.01); *G09G 2310/0262* (2013.01); *G09G 2320/0626* (2013.01); *G09G 2330/021* (2013.01)

(58) Field of Classification Search
  CPC ........ G02F 1/133601; G02F 1/133602; G09G 2320/0633; G09G 2320/064; G09G 2320/0646; G09G 3/3406; G09G 3/3426
  See application file for complete search history.

(56) References Cited

U.S. PATENT DOCUMENTS

| 2018/0180941 A1* | 6/2018 | Zhang | ............... G02F 1/133602 |
| 2019/0228718 A1* | 7/2019 | Lee | ....................... G09G 3/3406 |

FOREIGN PATENT DOCUMENTS

| CN | 1551086 | 12/2004 |
| CN | 110299107 | 10/2019 |
| CN | 111754924 | 10/2020 |
| CN | 214175661 | 9/2021 |
| CN | 114627837 | 6/2022 |
| CN | 114708819 | 7/2022 |
| CN | 114937435 | 8/2022 |
| JP | 2008145648 | 6/2008 |
| JP | 2010145446 | 7/2010 |

OTHER PUBLICATIONS

CNIPA, Notification to Grant Patent Right for Invention for CN Application No. 202211637930.9, dated Feb. 1, 2023.

* cited by examiner

*Primary Examiner* — Insa Sadio
(74) *Attorney, Agent, or Firm* — Hodgson Russ LLP (57) ABSTRACT

The display driving architecture is configured to drive a display panel which includes: a pixel assembly; the pixel assembly includes a driving transistor and a light-emitting assembly; the driving transistor has a first end connected to a first power end and a second end connected to an anode of the light-emitting assembly, and a cathode of the light-emitting assembly is connected to a second power end; a switching circuit which includes a first switching assembly configured to output a first voltage, a second switching assembly configured to output a second voltage, and a voltage output end; assembly; and the switching circuit outputs, based on high-grayscale data of the pixel assembly, the first voltage to the voltage output end, or outputs, based on low-grayscale data of the pixel assembly, the second voltage to the voltage output end.

17 Claims, 6 Drawing Sheets

DISPLAY DRIVING ARCHITECTURE, DISPLAY DRIVING METHOD, AND DISPLAY DEVICE

CROSS-REFERENCE TO RELATED DISCLOSURES

This application claims priority to Chinese Patent Application No. 202211637930.9, filed Dec. 20, 2022, the entire disclosure of which is incorporated herein by reference.

TECHNICAL FIELD

The present disclosure relates to the technical field of display driving, in particular to a display driving architecture, a display driving method, and a display device.

BACKGROUND

Driving transistors are arranged in an OLED (Organic Light-Emitting Diode) display panel to control turn-on or turn-off of OLEDs. A current flowing through a driving transistor is a current flowing through an OLED. To achieve different light-emitting brightness of the OLED, different resistances are achieved by controlling a voltage difference between a gate and a source of the driving transistor, to achieve different currents.

During high-grayscale display, the voltage difference between the gate and source of the driving transistor is increased, and a resistance of the driving transistor is reduced, to increase a current of the driving transistor, thus improving the grayscale brightness of the OLED, and achieving the high-grayscale display. During low-grayscale display, the voltage difference between the gate and source of the driving transistor is reduced, and the resistance of the driving transistor is increased, to reduce the current of the driving transistor, thus achieving the low-grayscale display of the OLED.

SUMMARY

There are provided a display driving architecture, a display driving method, and a display device, according to embodiments of the present disclosure. The technical solution is as below:

According to one aspect of the present disclosure, there is provided a display driving architecture, configured to drive a display panel, where the display panel includes a pixel assembly, the pixel assembly includes a driving transistor and a light-emitting assembly, the driving transistor has a first end connected to a first power end and a second end connected to an anode of the light-emitting assembly, and a cathode of the light-emitting assembly is connected to a second power end; and the display driving architecture includes a switching circuit, the switching circuit includes a first switching assembly, a second switching assembly, and a voltage output end, the first switching assembly and the second switching assembly are connected to the voltage output end, respectively, the voltage output end is connected to the first power end or the second power end, the first switching assembly is configured to output a first voltage, the second switching assembly is configured to output a second voltage, the switching circuit outputs, based on high-grayscale data of the pixel assembly, the first voltage to the voltage output end, or outputs, based on low-grayscale data of the pixel assembly, the second voltage to the voltage output end, and the first voltage is higher than the second voltage;

wherein when the switching circuit outputs the second voltage, a current flowing through the driving transistor corresponds to the low-grayscale data of the pixel assembly, and a resistance of the driving transistor is reduced, to reduce the heating power consumption of the driving transistor.

According to a second aspect of the present disclosure, there is provided a display driving method for driving a display panel, where the display panel includes a pixel assembly, the pixel assembly includes a driving transistor and a light-emitting assembly, the driving transistor has a first end connected to a first power end and a second end connected to an anode of the light-emitting assembly, and a cathode of the light-emitting assembly is connected to a second power end; and the display driving method includes:

obtaining grayscale data of the pixel assembly that includes high-grayscale data and low-grayscale data; and outputting, based on the high-grayscale data, a first voltage to the first power end or the second power end, and outputting, based on the low-grayscale data, a second voltage to the first power end or the second power end;

wherein when the second voltage is output, a current flowing through the driving transistor corresponds to the low-grayscale data of the pixel assembly, and a resistance of the driving transistor is reduced, to reduce the heating power consumption of the driving transistor.

It should be understood that the above general description and the following detailed description are exemplary only and are not intended to limit the present disclosure.

BRIEF DESCRIPTION OF THE DRAWINGS

The above and other objectives, features and advantages of the present disclosure will become more apparent by describing exemplary embodiments thereof in detail with reference to the accompanying drawings.

DETAILED DESCRIPTION OF THE EMBODIMENTS

Although the present disclosure may readily be embodied in different forms of embodiment, however, only some of the specific embodiments are shown in the drawings and will be described in detail in this specification, while it is understandable that this specification should be regarded as an exemplary illustration of the principle of the present disclosure and is not intended to limit the present disclosure to those described herein.

Thus, one feature pointed out in this specification is intended to illustrate one of the features of one embodiment of the present disclosure and is not intended to imply that each embodiment of the present disclosure must have the illustrated feature. In addition, it should be noted that many features are described in this specification. Although certain features may be combined to illustrate a possible system design, these features may also be used for other unspecified combinations. Therefore, the illustrated combinations are not intended to be limiting, unless otherwise stated.

In the embodiments illustrated in the drawings, indications of directions (such as up, down, left, right, front, and back) are used to explain that the structures and movements of various elements of the present disclosure are not absolute but relative. These descriptions are appropriate when these elements are located in the positions shown in the drawings. If the description of the positions of these elements changes, the indications of these directions change accordingly.

The exemplary embodiments will now be described more fully with reference to the accompanying drawings. However, the exemplary embodiments can be implemented in various forms and should not be understood to be limited to the examples elaborated herein; and rather, these exemplary embodiments are provided so that the description of the present disclosure will be more comprehensive and complete, and the concept of exemplary embodiments will be fully communicated to those skilled in the art. The accompanying drawings are only schematic illustrations of the present disclosure and are not necessarily drawn to scale. Like reference signs in the figures denote identical or similar parts and thus repetitive descriptions thereof will be omitted.

The preferred embodiment of the present disclosure is further elaborated below in conjunction with the accompanying drawings of this specification.

Embodiment 1

Figure 1:
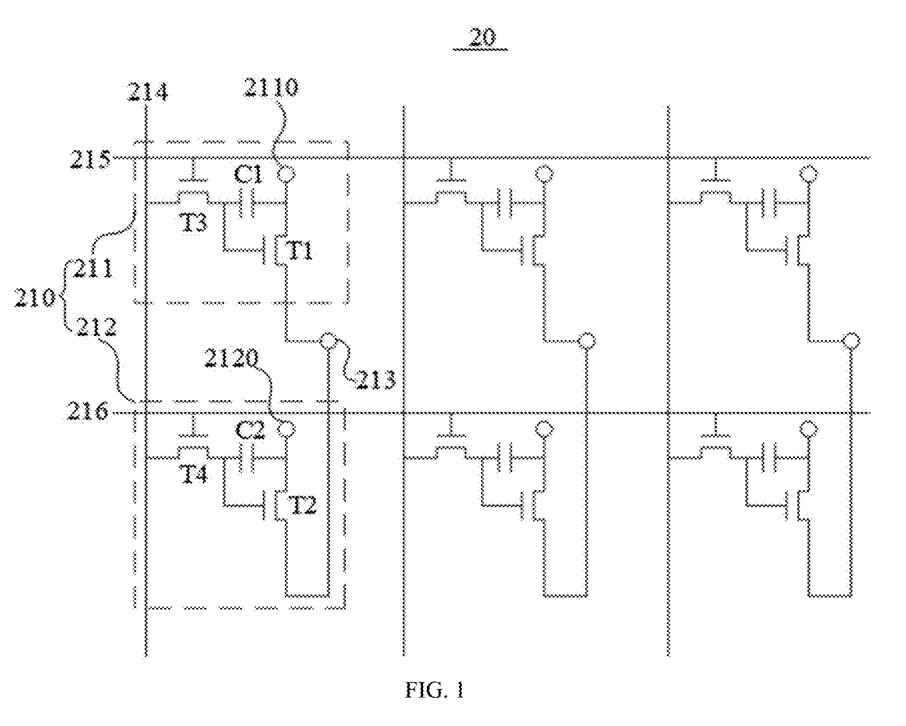
FIG. 1 is a schematic structural diagram of a display driving architecture in a first embodiment of the present disclosure.
Figure 2:
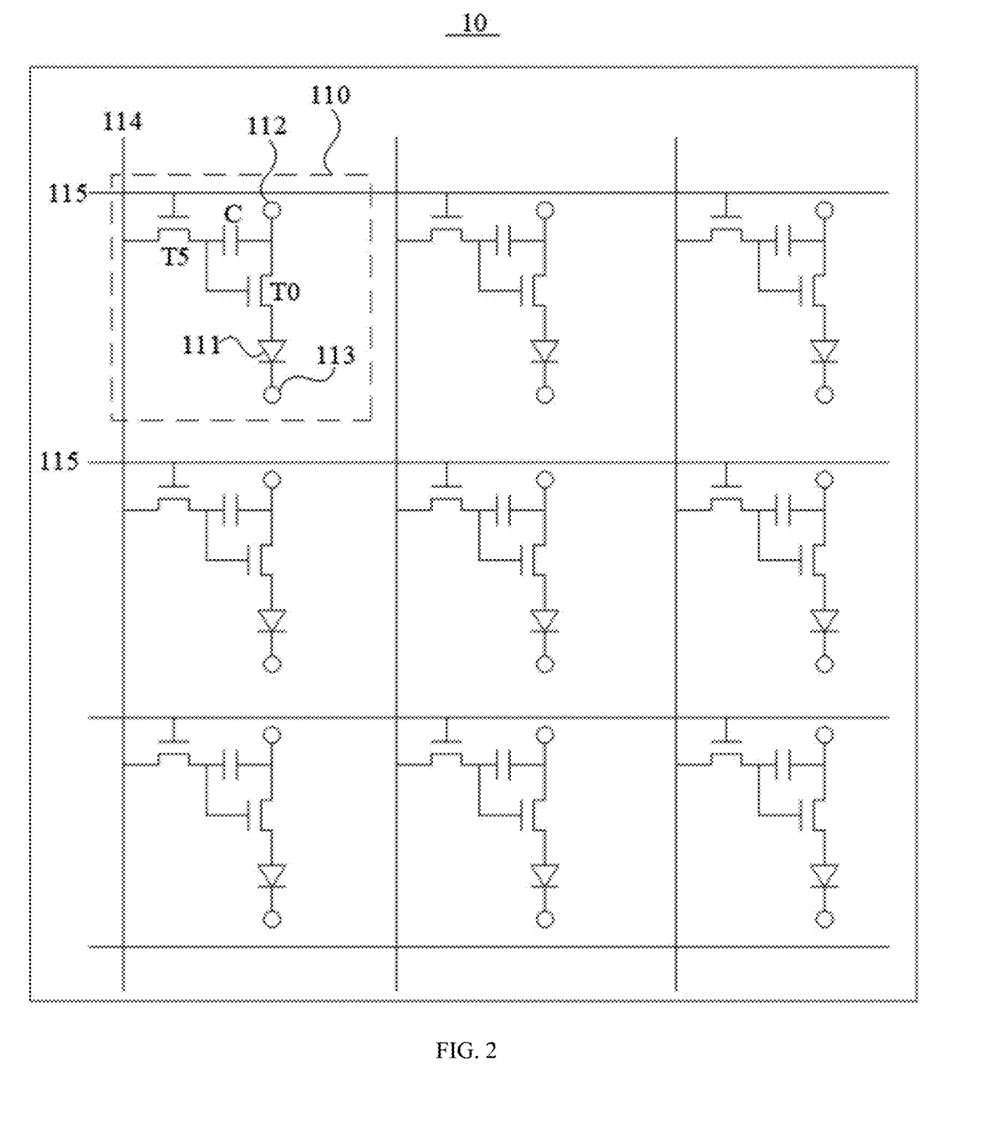
FIG. 2 is a schematic structural diagram of a display pixel in the present disclosure.

As shown in FIG. 1 and FIG. 2, the present disclosure discloses a display driving architecture 20. The technical solution of the present disclosure may be applied to a display panel having a light-emitting diode (LED) or an organic light-emitting diode (OLED).

The display panel 10 includes a pixel assembly 110. The pixel assembly 110 includes a driving transistor T0 (a thin film transistor, TFT) and a light-emitting assembly 111. The light-emitting assembly 111 is the LED or the OLED. The driving transistor T0 has a first end connected to a first power end 112 and a second end connected to an anode of the light-emitting assembly 111, and a cathode of the light-emitting assembly 111 is connected to a second power end 113. Generally speaking, the first power end 112 provides an operating voltage, such as ELVDD, of the light-emitting assembly 111, and the second power end 113 is connected to a common end, such as a common ground end ELVSS, of the light-emitting assembly 111. A current of the light-emitting assembly 111 flows from the anode of the light-emitting assembly 111 to the cathode of the light-emitting assembly 111.

The display driving architecture 20 includes a switching circuit 210. The switching circuit 210 includes a first switching assembly 211, a second switching assembly 212, and a voltage output end 213. The first switching assembly 211 and the second switching assembly 212 are connected to the voltage output end 213, respectively. The voltage output end 213 is connected to the first power end 112 or the second power end 113. The pixel assembly 110 is powered by the voltage output end 213. The first switching assembly 211 is configured to output a first voltage. The second switching assembly 212 is configured to output a second voltage. The switching circuit 210 outputs, based on high-grayscale data of the pixel assembly 110, the first voltage to the voltage output end 213, or outputs, based on low-grayscale data of the pixel assembly 110, the second voltage to the voltage output end 213, where the first voltage is higher than the second voltage.

When performing high-grayscale display, the pixel assembly 110 generates the high-grayscale data in advance, and the switching circuit 210 outputs, based on the high-grayscale data, the first voltage to the voltage output end 213 by the first switching assembly 211. The driving transistor T0 has a control end, a first end, and a second end. In general, the control end refers to a gate of the driving transistor T0, the first end refers to a drain, and the second end refers to a source. Of course, the first end may also refer to a source and the second end may also refer to a drain. When a current of the driving transistor T0 is controlled, a voltage difference between the gate and the source of the driving transistor T0 is increased. The voltage difference between the gate and the source is usually increased by increasing a gate voltage, thus allowing a turn-on degree of the driving transistor T0 to be higher and reducing a channel resistance. A voltage difference between the drain and the source determines a magnitude of the current flowing through the driving transistor T0. The first voltage is higher, and the voltage difference between the drain and the source increases when the first voltage is applied to the drain, so that the current is higher. In other words, the current flowing through the light-emitting assembly 111 is higher, and the light-emitting assembly 111 is brighter, thus completing the high-grayscale display.

When performing low-grayscale display, the pixel assembly 110 generates the low-grayscale data in advance, and the switching circuit 210 outputs, based on the low-grayscale data, the second voltage to the voltage output end 213 by the second switching assembly 212. The current corresponding to the low-grayscale display is lower. By applying the second voltage to the drain, the voltage difference between the drain and the source decreases, so that the current is reduced. In other words, the current flowing through the light-emitting assembly 111 is lower, and the brightness of the light-emitting assembly 111 is reduced, thus completing the low-grayscale display. In this case, the gate voltage of the driving transistor T0 is kept higher, so that the voltage difference between the gate and the source is kept higher. As a result, the turn-on degree of the driving transistor T0 is still higher, and the formed channel resistance is smaller. The current flowing through the driving transistor T0 corresponds to the low-grayscale data of the pixel assembly 110, that is, it is ensured that the low-grayscale current corresponding to the display of the light-emitting assembly 111 is constant, so that the heating power consumption of the driving transistor T0 is reduced when a resistance of the driving transistor T0 is reduced.

A formula is used for description, where Q represents the heating power consumption of the driving transistor, I represents the voltage flowing through the driving transistor T0, and R represents the channel resistance of the driving transistor T0, that is, the resistance. $Q=I*I*R$, where when the current I remains unchanged and R decreases, it indicates that the heating power consumption is reduced.

In the technical solution of this embodiment, the high-grayscale display corresponds to the high-grayscale data. When the turn-on brightness of the light-emitting assembly 111 is higher, the switching circuit 210 outputs, based on the high-grayscale data of the pixel assembly 110, the first voltage to the voltage output end 213. When the voltage difference between the gate and the source of the driving transistor T0 is larger, the resistance of the driving transistor T0 is lower, and under the action of being in combination with the first voltage, the current of the driving transistor T0 is higher, thus achieving the high-grayscale display of the light-emitting assembly 111.

The low-grayscale display corresponds to the low-grayscale data. When the turn-on brightness of the light-emitting assembly 111 is lower, the switching circuit 210 outputs, based on the low-grayscale data of the pixel assembly 110, the second voltage to the voltage output end 213. At this time, in the case of maintaining the voltage difference between the gate and the source of the driving transistor T0 to be larger, that is, when it is ensured that the resistance of the driving transistor T0 is smaller, the voltage difference between the source and the drain of the driving transistor T0 is reduced through the output of the second voltage, to reduce the current of the driving transistor T0, thus achieving the low-grayscale display. It may be seen from this that the present disclosure achieves the low-grayscale display by reducing the current of the driving transistor T0 and can ensure that the resistance of the driving transistor T0 is smaller, thus reducing the heat loss of the driving transistor T0 and the power consumption.

Further, the resistance of the driving transistor T0 is affected by the voltage difference between the gate and the source. The larger the voltage difference is, the smaller the resistance is. The smaller the voltage difference is, the larger the resistance is. The current flowing through the driving transistor T0 is affected by the voltage difference between the drain and the source. The larger the voltage difference is, the higher the current is. The smaller the voltage difference is, and the lower the current is. The technical solution of the present disclosure achieves the low-grayscale display in the case of the lower resistance by adjusting the voltage difference between the drain and the source.

To implement effective switching of the first voltage and the second voltage, the first switching assembly 211 includes a first control switch T1 and a first power connection end 2110. The first voltage is input to the first switching assembly 211 by the first power connection end 2110. The first control switch T1 has a first end connected to the first power connection end 2110 and a second end connected to the voltage output end 213. A control end of the first control switch T1 responds to a first control signal, to provide a first voltage of the first power connection end 2110 to the voltage output end 213. After the high-grayscale data is generated, the first control signal is generated based on the high-grayscale data. After the control end of the first control switch T1 receives the first control signal, the first end and the second end of the first control switch T1 communicate with each other, and the first voltage is output from the first end to the second end. The second end is connected to the voltage output end 213. Thus, the first voltage is output to the first power end 112 or the second power end 113 of the pixel assembly 110 by the voltage output end 213.

The second switching assembly 212 includes a second control switch T2 and a second power connection end 2120. The second control switch T2 has a first end connected to the second power connection end 2120 and a second end connected to the voltage output end 213. A control end of the second control switch T2 responds to a second control signal, to provide a second voltage of the second power connection end 2120 to the voltage output end 213. After the low-grayscale data is generated, the second control signal is generated based on the low-grayscale data. After the control end of the second control switch T2 receives the second control signal, the first end and the second end of the second control switch T2 communicate with each other, and the second voltage is output from the first end to the second end. The second end is connected to the voltage output end 213. Thus, the second voltage is output to the first power end 112 or the second power end 113 of the pixel assembly 110 by the voltage output end 213. The first control switch T1 and the second control switch T2 are TFTs, such as N-type TFTs. When the first control signal is at a high level and the second control signal is at a low level, the first control switch T1 is turned on. When the first control signal is at a low level and the second control signal is at a high level, the second control switch T2 is turned on.

To furthermore effectively control the operation of the switching circuit 210, the switching circuit 210 further includes a first data line 214, a first scan line 215, and a second scan line 216. The first data line 214 extends vertically, the first scan line 215 and the second scan line 216 extend horizontally, the first scan line 215 is configured to control the first switching assembly 211, and the second scan line 216 is configured to control the second switching assembly 212.

The first switching assembly 211 further includes a third control switch T3 and a first capacitor C1. The third control switch T3 has a control end connected to the first scan line 215, a first end connected to the first data line 214, and a second end connected to a first electrode plate of the first capacitor C1. A second electrode plate of the first capacitor C1 is connected to a line between the first control switch T1 and the first power connection end 2110. The control end of the first control switch T1 is connected to a line between the third control switch T3 and the first capacitor C1.

During the high-grayscale display, the first scan line 215 transmits a high level, and the second scan line 216 transmits a low level. The third control switch T3 is an N-type TFT. After the control end of the third control switch T3 receives a high-level signal, the first end and the second end of the third control switch T3 are turned on. When a signal from the first data line 214 transmits the first control signal to the first control switch T1, the first control switch T1 is turned on, and the first voltage is transmitted to the voltage output end 213. Through the arrangement of the first capacitor C1, the first capacitor C1 may be charged through the first data line 214. The first capacitor C1 can store electricity, so that the first control switch T1 may be maintained to be turned on within a certain period of time, thus ensuring that the first voltage is continuously applied to the driving transistor T0, and maintaining a turn-on state of the light-emitting assembly 111.

The second switching assembly 212 further includes a fourth control switch T4 and a second capacitor C2. The fourth control switch T4 has a control end connected to the second scan line 216, a first end connected to the first data line 214, and a second end connected to a first electrode plate of the second capacitor C2. A second electrode plate of the second capacitor C2 is connected to a line between the second control switch T2 and the second power connection end 2120. The control end of the second control switch T2 is connected to a line between the fourth control switch T4 and the second capacitor C2.

During the low-grayscale display, the first scan line 215 transmits a low level, and the second scan line 216 transmits a high level. The fourth control switch T4 is an N-type TFT. After the control end of the fourth control switch T4 receives a high-level signal, the first end and the second end of the fourth control switch T4 are turned on. When the signal from the first data line 214 transmits the second control signal to the second control switch T2, the second control switch T2 is turned on, and the second voltage is transmitted to the voltage output end 213. Through the arrangement of the second capacitor C2, the second capacitor C2 may be charged through the first data line 214. The second capacitor C2 can store electricity, so that the second control switch T2 may be maintained to be turned on within a certain period of time, thus ensuring that the second voltage is continuously applied to the driving transistor T0, and maintaining a turn-on state of the light-emitting assembly 111. Of course, the control switch may also be a P-type TFT, which is turned on in response to a low level.

It may be seen that the first data line 214 is configured to provide the first control signal and the second control signal. The first control signal and the second control signal are same control signals, both of which are high-level signals.

The display panel 10 includes a transparent substrate. The pixel assembly 110 is arranged on a surface of the transparent substrate. The pixel assembly 110 includes a second data line 114, a third scan line 115, a response switch T5, and a storage capacitor C. The response switch T5 has a control end connected to the third scan line 115, a first end connected to the second data line 114, and a second end connected to a first electrode of the storage capacitor C. A second electrode of the storage capacitor C is connected to a line between the driving transistor T0 and the first power end 112. A control end of the driving transistor T0 is connected to a line between the response switch T5 and the storage capacitor C.

When the pixel assembly 110 performs normal display, the third scan line 115 provides a high-level signal, the control end of the response switch T5 responds to the high-level signal, and the first end and the second end of the response switch T5 are turned on; the second data line 114 provides a high-level signal to be transmitted to the control end of the driving transistor T0, the driving transistor T0 responds to the high-level signal, and the first end and the second end of the driving transistor T0 are turned on; and the voltage output by the switching circuit 210 is applied to the first end of the driving transistor T0, to turn on the light-emitting assembly 111. Moreover, the storage capacitor C is charged through the second data line 114. The driving transistor T0 is maintained to be turned on by the storage capacitor C, to ensure that the light-emitting assembly 111 is turned on within a certain period of time.

To reduce the blocking of light, the first data line 214 is located in an orthographic projection of the second data line 114 on the transparent substrate. As a result, even if the first data line 214 is added, the light emitted by the light-emitting assembly 111 will not be additionally blocked. Moreover, a structural layout is simplified to fully utilize a structural space. The first data line 214 and the second data line 114 may also be same data lines. In other words, a data signal from the switching circuit 210 and a data signal from the pixel assembly 110 are same. When the pixel assembly 110 is turned on, the corresponding display driving architecture 20 needs to output the corresponding voltage. Therefore, the pixel assembly and the display driving architecture may synchronously receive data signals.

In addition, the separation of the first data line 214 from the second data line 114 may make the control of the switching circuit 210 and the pixel assembly 110 more flexible.

Moreover, to further reduce the blocking of light, the first scan line 215 is located in an orthographic projection of one third scan line 115 on the transparent substrate, and the second scan line 216 is located in an orthographic projection of another third scan line 115 on the transparent substrate. As a result, the scan lines and the data lines of the display driving architecture 20 are located in orthographic projections of the scan lines and the data lines of the pixel assembly 110, respectively, without additional blocking of the light.

To improve the switching control efficiency, the display panel 10 includes a plurality of pixel groups. Each of the pixel groups includes at least two pixel assemblies 110. The pixel assemblies 110 in the same pixel group are all connected to the voltage output end 213 of the same switching circuit 210. In other words, one switching circuit 210 may simultaneously control the brightness of two pixel assemblies 110, thereby improving the control efficiency.

Of course, there may be more than two pixel assemblies 110 controlled, such as five pixel assemblies 110 in a horizontal direction and three pixel assemblies 110 in a vertical direction, and one pixel group includes fifteen pixel assemblies 110. One switching circuit 210 simultaneously controls magnitudes of voltages of fifteen pixel assemblies 110.

Figure 6:
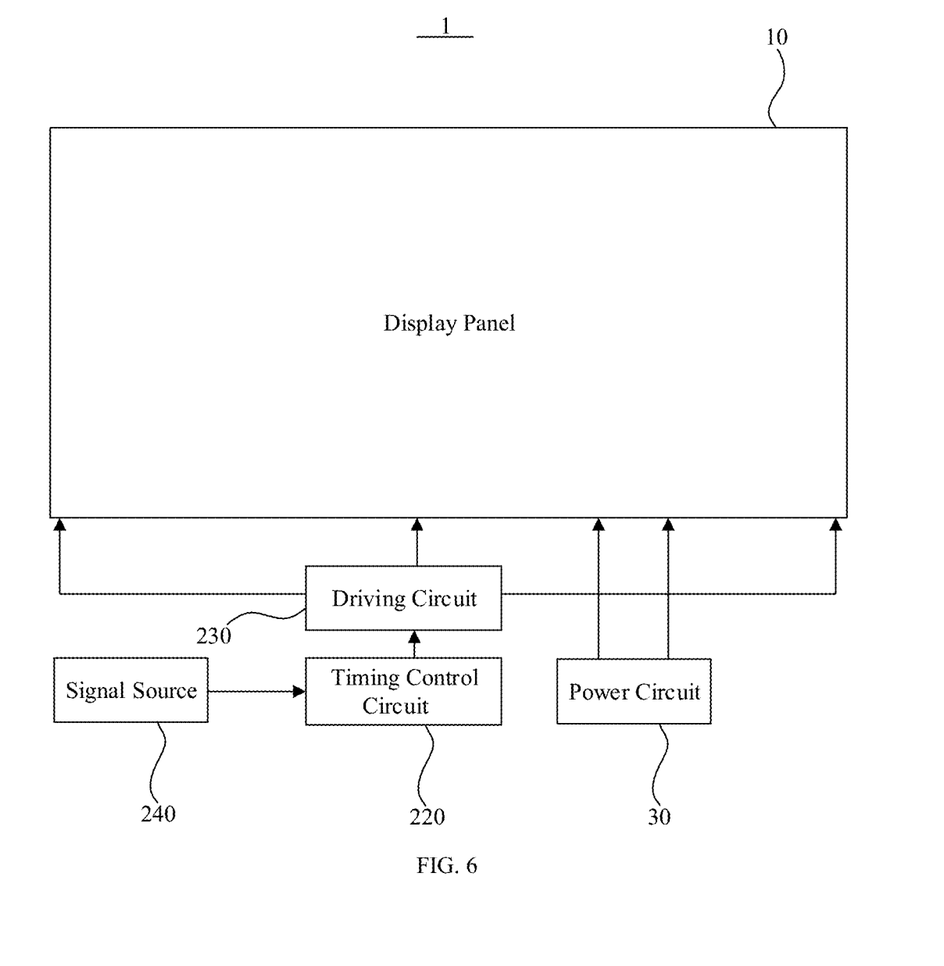
FIG. 6 is a schematic structural diagram of a display device in a third embodiment of the present disclosure.

As shown in FIG. 6, the display driving architecture 20 further includes a timing control circuit 220 and a driving circuit 230. The timing control circuit 220 is connected to the driving circuit 230, and the driving circuit 230 is connected to the switching circuit 210.

The timing control circuit 220 is configured to obtain the high-grayscale data or the low-grayscale data of the pixel assembly 110 and to generate a first driving instruction according to the high-grayscale data and generate a second driving instruction according to the low-grayscale data. Whether the pixel assembly 110 displays high grayscale or low grayscale is controlled by grayscale data input by a signal source 240. The signal source 240 transmits the grayscale data to the timing control circuit 220, where the grayscale data already includes the high-grayscale data and the low-grayscale data. The timing control circuit 220 generates corresponding driving instructions according to different data contents. That is, the timing control circuit generates the first driving instruction according to the high-grayscale data and generates the second driving instruction according to the low-grayscale data.

The driving circuit 230 is connected to the timing control circuit 220. The driving circuit 230 receives the first driving instruction or the second driving instruction, and controls, based on the first driving instruction, the switching circuit 210 to output the first voltage, and outputs, based on the second driving instruction, the switching circuit 210 to output the second voltage.

Specifically, the driving circuit 230 may be understood as a driving chip. After receiving the first driving instruction, the driving chip outputs a high level to the first data line 214, outputs a high level to the first scan line 215, and outputs a low level to the second scan line 216. Through the high level from the first scan line 215, the third control switch T3 is turned on. When the high level from the first data line 214 is output to the control end of the first control switch T1, the first control switch T1 is turned on, and the first voltage is output to the voltage output end 213.

After receiving the second driving instruction, the driving chip outputs a high level to the first data line 214, outputs a low level to the first scan line 215, and outputs a high level to the second scan line 216. Through the high level from the second scan line 216, the fourth control switch T4 is turned on. When the high level from the first data line 214 is output to the control end of the second control switch T2, the second control switch T2 is turned on, and the second voltage is output to the voltage output end 213.

Embodiment 2

Figure 3:
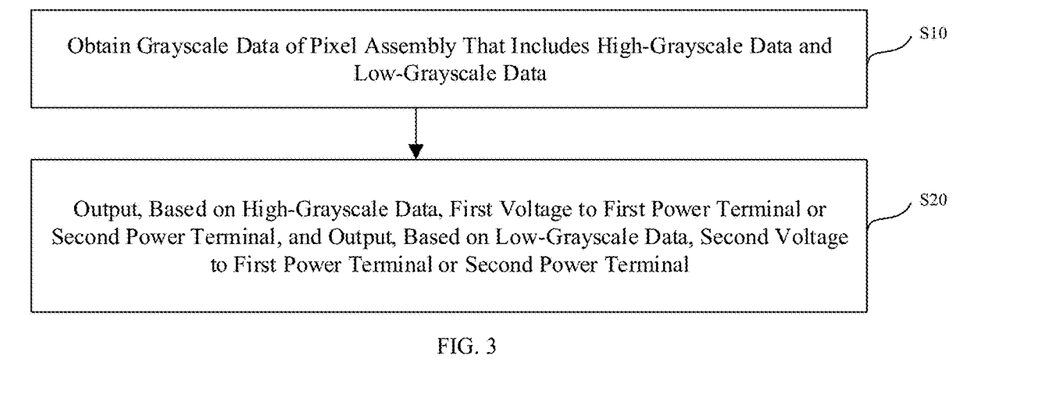
FIG. 3 is a schematic flowchart of steps of a display driving method in a second embodiment of the present disclosure.

As shown in FIG. 3, the present disclosure further provides a display driving method for driving a display panel 10, where the display panel 10 includes a pixel assembly 110, the pixel assembly 110 includes a driving transistor T0 and a light-emitting assembly 111, the driving transistor T0 has a first end connected to a first power end 112 and a second end connected to an anode of the light-emitting assembly 111, and a cathode of the light-emitting assembly 111 is connected to a second power end 113; and the display driving method includes:

Step S10: obtaining grayscale data of the pixel assembly 110 that includes high-grayscale data and low-grayscale data; and inputting the grayscale data through a signal source 240, and recognizing the high-grayscale data and the low-grayscale data in the grayscale data.

Step S20: outputting, based on the high-grayscale data, a first voltage to the first power end 112 or the second power end 113, and outputting, based on the low-grayscale data, a second voltage to the first power end 112 or the second power end 113.

If the grayscale data is the high-grayscale data, a timing control circuit 220 generates a first driving instruction based on the high-grayscale data and transmits the first driving instruction to a driving circuit 230, and based on the first driving instruction, the driving circuit 230 outputs a high level to a first data line 214, outputs a high level to a first scan line 215, and outputs a low level to a second scan line 216. A fourth control switch T4 is turned off in response to a low level. Through the high level from the first scan line 215, the third control switch T3 is turned on. When the high level from the first data line 214 is output to the control end of the first control switch T1, the first control switch T1 is turned on, and the first voltage is output to the voltage output end 213. The first voltage may be output to the first power end 112 or the second power end 113. In other words, a voltage difference between a drain and a source may be adjusted by adjusting a drain voltage of the driving transistor T0. The voltage difference between the drain and the source may also be adjusted by adjusting a source voltage of the driving transistor T0.

If the grayscale data is the low-grayscale data, the timing control circuit 220 generates a second driving instruction based on the low-grayscale data and transmits the second driving instruction to the driving circuit 230, and based on the second driving instruction, the driving circuit 230 outputs a high level to the first data line 214, outputs a low level to the first scan line 215, and outputs a high level to the second scan line 216. The third control switch T3 is turned off in response to a low level. Through the high level from the second scan line 216, the fourth control switch T4 is turned on. When the high level from the first data line 214 is output to the control end of the second control switch T2, the second control switch T2 is turned on, and the second voltage is output to the voltage output end 213. The second voltage may be output to the first power end 112 or the second power end 113.

When the second voltage is output, a current flowing through the driving transistor T0 corresponds to the low-grayscale data of the pixel assembly 110, and a resistance of the driving transistor T0 is reduced, to reduce the heating power consumption of the driving transistor T0. Specifically, a current corresponding to low-grayscale display is lower. By applying the second voltage to the drain, the voltage difference between the drain and the source decreases, so that the current is reduced. In other words, the current flowing through the light-emitting assembly 111 is lower, and the brightness of the light-emitting assembly 111 is reduced, thus completing the low-grayscale display. In this case, the gate voltage of the driving transistor T0 is kept higher, so that the voltage difference between the gate and the source is kept higher. As a result, the turn-on degree of the driving transistor T0 is still higher, and the formed channel resistance is smaller. The current flowing through the driving transistor T0 corresponds to the low-grayscale data of the pixel assembly 110, that is, it is ensured that the low-grayscale current corresponding to the display of the light-emitting assembly 111 is constant, so that the heating power consumption of the driving transistor T0 is reduced when a resistance of the driving transistor T0 is reduced.

Figure 4:
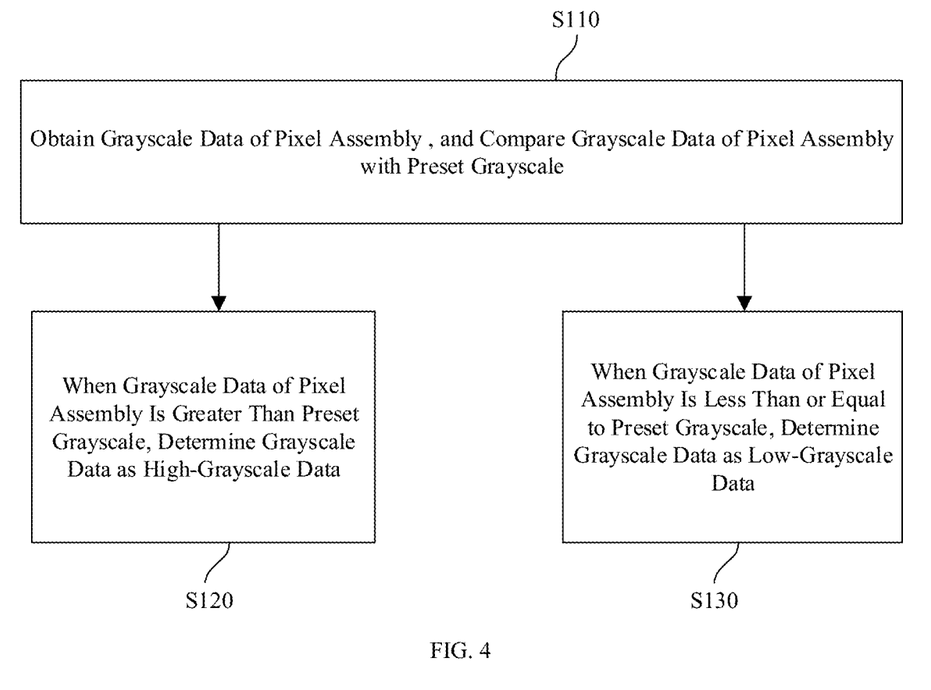
FIG. 4 is a schematic diagram of a specific process of a step S10 of a display driving method in the present disclosure.

As shown in FIG. 4, the step of obtaining high-grayscale data of the pixel assembly 110 or low-grayscale data of the pixel assembly 110 includes:

Step S110: obtaining grayscale data of the pixel assembly 110, and comparing the grayscale data of the pixel assembly 110 with preset grayscale, where the grayscale data ranges from 0 to 255, 0 represents pure black, 255 represents pure white, and data between 0 and 255 represents a transition from the pure black to the pure white.

Step S120: when the grayscale data of the pixel assembly 110 is greater than the preset grayscale, determining that the grayscale data is high-grayscale data; and after obtaining the grayscale data, recognizing and determining whether the grayscale data belongs to the high-grayscale data, where the preset grayscale is, for example, 127. If the grayscale data is 200 of greater than 127, it is determined that the grayscale data is the high-grayscale data.

Step S130: when the grayscale data of the pixel assembly 110 is less than or equal to the preset grayscale, determining that the grayscale data is low-grayscale data. If the grayscale data is 120 of less than 127, it is determined that the grayscale data is the low-grayscale data. Preset grayscale data may be adjusted, for example, the preset grayscale is 120, 150, or 200.

Figure 5:
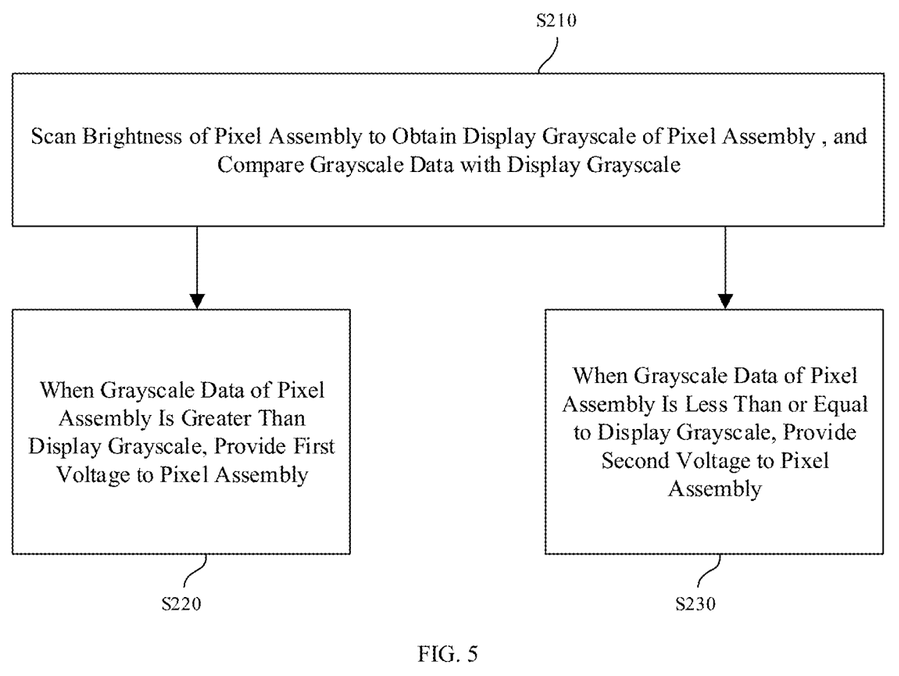
FIG. 5 is a schematic diagram of a specific process of a step S20 of a display driving method in the present disclosure.

As shown in FIG. 5, positions of some pixel assemblies 110 of the display panel 10 are too bright or too dark. To reduce this situation, after the step of obtaining grayscale data of the pixel assembly 110, the method includes:

Step S210: scanning the brightness of the pixel assembly 110 to obtain display grayscale of the pixel assembly 110, and comparing the grayscale data with the display grayscale. The grayscale data may be understood as a brightness instruction provided to the pixel assembly 110, and the display grayscale may be understood as the true brightness of the pixel assembly 110. Whether the brightness of display conforms to the provided brightness instruction may be determined by comparing the grayscale data with the display grayscale.

Step S220: when the grayscale data of the pixel assembly 110 is greater than the display grayscale, providing the first voltage to the pixel assembly 110. If the grayscale data of the pixel assembly 110 is greater than the display grayscale, it indicates that the brightness of the pixel assembly 110 is too low, and the first voltage is provided to the pixel assembly 110, to increase the brightness of the light-emitting assembly 111 in the pixel assembly 110.

Step S230: when the grayscale data of the pixel assembly 110 is less than or equal to the display grayscale, providing the second voltage to the pixel assembly 110. If the grayscale data of the pixel assembly 110 is less than or equal to the display grayscale, it indicates that the brightness of the pixel assembly 110 is too high, and the second voltage is provided to the pixel assembly 110, to reduce the brightness of the light-emitting assembly 111 in the pixel assembly 110.

In addition, there is screen burn-in for the display panel 10. The screen burn-in refers to that the loss of the pixel assembly 110 and the attenuation of screen brightness are accelerated since the display panel 10 is in a stationary picture for a long time, and if the picture is switched, residual shadows will appear in positions of some pixel assemblies 110. Through switching between the first voltage and the second voltage, the situation that the pixel assembly 110 is at a certain operating voltage for a long time can be reduced, thereby alleviating the screen burn-in and prolonging the service life of the display panel 10.

Embodiment 3

As shown in FIG. 6, the present disclosure further provides a display device 1, including a display panel 10, the display driving architecture 20 as described above, and a power circuit 30 connected to a first switching assembly 211 and a second switching assembly 212, respectively, and configured to provide a first voltage to the first switching assembly 211 and to provide a second voltage to the second switching assembly 212. Through switching between the first switching assembly 211 and the second switching assembly 212, the first voltage or the second voltage is provided to a voltage output end 213.

In the technical solution of the present disclosure, high-grayscale display corresponds to the high-grayscale data. When the turn-on brightness of the light-emitting assembly is higher, the switching circuit outputs, based on the high-grayscale data of the pixel assembly, the first voltage to the voltage output end. When a voltage difference between a gate and a source of the driving transistor is larger, the resistance of the driving transistor is lower, and under the action of being in combination with the first voltage, a current of the driving transistor is higher, thus achieving the high-grayscale display of the light-emitting assembly.

Low-grayscale display corresponds to the low-grayscale data. When the turn-on brightness of the light-emitting assembly is lower, the switching circuit outputs, based on the low-grayscale data of the pixel assembly, the second voltage to the voltage output end. At this time, in the case of maintaining the voltage difference between the gate and the source of the driving transistor to be larger, that is, when it is ensured that the resistance of the driving transistor is smaller, a voltage difference between the source and a drain of the driving transistor is reduced through the output of the second voltage, to reduce the current of the driving transistor, thus achieving the low-grayscale display. It may be seen from this that the present disclosure achieves the low-grayscale display by reducing the current of the driving transistor and can ensure that the resistance of the driving transistor is smaller, thus reducing the heat loss of the driving transistor and the power consumption.

Although the present disclosure has been described with reference to several exemplary embodiments, it should be understood that the terms used are illustrative and exemplary and are not limiting. Since the present disclosure can be embodied in various forms without departing from the spirit or essence of the invention, it should be understood that the foregoing embodiments are not limited to any of the foregoing details, but are to be interpreted broadly within the spirit and scope defined by the appended claims, so that all variations and modifications falling within the scope of the claims or their equivalents are to be covered by the appended claims.

What is claimed is:

1. A display driving architecture, configured to drive a display panel, wherein the display panel comprises a pixel assembly, the pixel assembly comprises a driving transistor and a light-emitting assembly, the driving transistor has a first end connected to a first power end and a second end connected to an anode of the light-emitting assembly, and a cathode of the light-emitting assembly is connected to a second power end, wherein the display driving architecture comprises:

a switching circuit, the switching circuit comprises a first switching assembly, a second switching assembly, and a voltage output end, the first switching assembly and the second switching assembly are connected to the voltage output end, respectively, the voltage output end is connected to the first power end or the second power end, the first switching assembly is configured to output a first voltage, the second switching assembly is configured to output a second voltage, the switching circuit outputs, based on high-grayscale data of the pixel assembly, the first voltage to the voltage output end, or outputs, based on low-grayscale data of the pixel assembly, the second voltage to the voltage output end, and the first voltage is higher than the second voltage;

wherein when the switching circuit outputs the second voltage, a current flowing through the driving transistor corresponds to the low-grayscale data of the pixel assembly, and a resistance of the driving transistor is reduced, to reduce heating power consumption of the driving transistor.

2. The display driving architecture according to claim 1, wherein the first switching assembly comprises a first control switch and a first power connection end, the first control switch has a first end connected to the first power connection end and a second end connected to the voltage output end, and a control end of the first control switch responds to a first control signal, to provide a first voltage of the first power connection end to the voltage output end;

wherein the second switching assembly comprises a second control switch and a second power connection end, the second control switch has a first end connected to the second power connection end and a second end connected to the voltage output end, and a control end of the second control switch responds to a second control signal, to provide a second voltage of the second power connection end to the voltage output end.

3. The display driving architecture according to claim 2, wherein the switching circuit further comprises a first data line, a first scan line, and a second scan line;

wherein the first switching assembly further comprises a third control switch and a first capacitor, the third control switch has a control end connected to the first scan line, a first end connected to the first data line, and a second end connected to a first electrode plate of the first capacitor, a second electrode plate of the first capacitor is connected to a line between the first control switch and the first power connection end, and a control end of the first control switch is connected to a line between the third control switch and the first capacitor; and wherein the second switching assembly further comprises a fourth control switch and a second capacitor, the fourth control switch has a control end connected to the second scan line, a first end connected to the first data line, and a second end connected to a first electrode plate of the second capacitor, a second electrode plate of the second capacitor is connected to a line between the second control switch and the second power connection end, and a control end of the second control switch is connected to a line between the fourth control switch and the second capacitor.

4. The display driving architecture according to claim 3, wherein the display panel comprises a transparent substrate, the pixel assembly is arranged on a surface of the transparent substrate, the pixel assembly comprises a second data line, a third scan line, a response switch, and a storage capacitor, the response switch has a control end connected to the third scan line, a first end connected to the second data line, and a second end connected to a first electrode of the storage capacitor, a second electrode of the storage capacitor is connected to a line between the driving transistor and the first power end, and a control end of the driving transistor is connected to a line between the response switch and the storage capacitor; and wherein the first data line is located in an orthographic projection of the second data line on the transparent substrate, or the first data line and the second data line are same data lines.

5. The display driving architecture according to claim 3, wherein the first control switch and the second control switch are N-type TFTs.

6. The display driving architecture according to claim 1, wherein the display panel comprises a plurality of pixel groups, each of the pixel groups comprises at least two pixel assemblies, and the pixel assemblies in a same pixel group are connected to the voltage output end of a same switching circuit.

7. The display driving architecture according to claim 1, further comprising:

a timing control circuit, configured to obtain the high-grayscale data or the low-grayscale data of the pixel assembly and to generate a first driving instruction according to the high-grayscale data and generate a second driving instruction according to the low-grayscale data; and a driving circuit, connected to the timing control circuit, wherein the driving circuit receives the first driving instruction or the second driving instruction, and controls, according to the first driving instruction, the switching circuit to output the first voltage, and controls, according to the second driving instruction, the switching circuit to output the second voltage.

8. A display driving method for driving a display panel, wherein the display panel comprises a pixel assembly, the pixel assembly comprises a driving transistor and a light-emitting assembly, the driving transistor has a first end connected to a first power end and a second end connected to an anode of the light-emitting assembly, and a cathode of the light-emitting assembly is connected to a second power end, and the display driving method comprises:

obtaining grayscale data of the pixel assembly that comprises high-grayscale data and low-grayscale data; and outputting, based on the high-grayscale data, a first voltage to the first power end or the second power end, and outputting, based on the low-grayscale data, a second voltage to the first power end or the second power end;

wherein when the second voltage is output, a current flowing through the driving transistor corresponds to the low-grayscale data of the pixel assembly, and a resistance of the driving transistor is reduced, to reduce heating power consumption of the driving transistor.

9. The display driving method according to claim 8, wherein the step of obtaining high-grayscale data of the pixel assembly or low-grayscale data of the pixel assembly comprises:

obtaining the grayscale data of the pixel assembly, and comparing the grayscale data of the pixel assembly with preset grayscale;

when the grayscale data of the pixel assembly is greater than the preset grayscale, determining the grayscale data as the high-grayscale data; and when the grayscale data of the pixel assembly is less than or equal to the preset grayscale, determining the grayscale data as the low-grayscale data.

10. The display driving method according to claim 8, wherein after the step of obtaining grayscale data of the pixel assembly, the method comprises:

scanning the brightness of the pixel assembly to obtain display grayscale of the pixel assembly, and comparing the grayscale data with the display grayscale;

when the grayscale data of the pixel assembly is greater than the display grayscale, providing the first voltage to the pixel assembly; and when the grayscale data of the pixel assembly is less than or equal to the display grayscale, providing the second voltage to the pixel assembly.

11. A display device, comprising:

a display panel;

a display driving architecture circuit configured to drive a display panel, wherein the display panel comprises a pixel assembly, the pixel assembly comprises a driving transistor and a light-emitting assembly, the driving transistor has a first end connected to a first power end and a second end connected to an anode of the light-emitting assembly, and a cathode of the light-emitting assembly is connected to a second power end;

wherein the display driving architecture comprises a switching circuit, the switching circuit comprises a first switching assembly, a second switching assembly, and a voltage output end, the first switching assembly and the second switching assembly are connected to the voltage output end, respectively, the voltage output end is connected to the first power end or the second power end, the first switching assembly is configured to output a first voltage, the second switching assembly is configured to output a second voltage, the switching circuit outputs, based on high-grayscale data of the pixel assembly, the first voltage to the voltage output end, or outputs, based on low-grayscale data of the pixel assembly, the second voltage to the voltage output end, and the first voltage is higher than the second voltage;

wherein when the switching circuit outputs the second voltage, a current flowing through the driving transistor corresponds to the low-grayscale data of the pixel assembly, and a resistance of the driving transistor is reduced, to reduce heating power consumption of the driving transistor; and wherein a power circuit is connected to the first switching assembly and the second switching assembly, respectively, and configured to provide the first voltage to the first switching assembly and to provide the second voltage to the second switching assembly.

12. The display device according to claim 11, wherein the first switching assembly comprises a first control switch and a first power connection end, the first control switch has a first end connected to the first power connection end and a second end connected to the voltage output end, and a control end of the first control switch responds to a first control signal, to provide a first voltage of the first power connection end to the voltage output end;

wherein the second switching assembly comprises a second control switch and a second power connection end, the second control switch has a first end connected to the second power connection end and a second end connected to the voltage output end, and a control end of the second control switch responds to a second control signal, to provide a second voltage of the second power connection end to the voltage output end.

13. The display device according to claim 12, wherein the switching circuit further comprises a first data line, a first scan line, and a second scan line;

wherein the first switching assembly further comprises a third control switch and a first capacitor, the third control switch has a control end connected to the first scan line, a first end connected to the first data line, and a second end connected to a first electrode plate of the first capacitor, a second electrode plate of the first capacitor is connected to a line between the first control switch and the first power connection end, and a control end of the first control switch is connected to a line between the third control switch and the first capacitor; and wherein the second switching assembly further comprises a fourth control switch and a second capacitor, the fourth control switch has a control end connected to the second scan line, a first end connected to the first data line, and a second end connected to a first electrode plate of the second capacitor, a second electrode plate of the second capacitor is connected to a line between the second control switch and the second power connection end, and a control end of the second control switch is connected to a line between the fourth control switch and the second capacitor.

14. The display device according to claim 13, wherein the display panel comprises a transparent substrate, the pixel assembly is arranged on a surface of the transparent substrate, the pixel assembly comprises a second data line, a third scan line, a response switch, and a storage capacitor, the response switch has a control end connected to the third scan line, a first end connected to the second data line, and a second end connected to a first electrode of the storage capacitor, a second electrode of the storage capacitor is connected to a line between the driving transistor and the first power end, and a control end of the driving transistor is connected to a line between the response switch and the storage capacitor; and wherein the first data line is located in an orthographic projection of the second data line on the transparent substrate, or the first data line and the second data line are same data lines.

15. The display device according to claim 12, wherein the first control switch and the second control switch are N-type TFTs.

16. The display device according to claim 11, wherein the display panel comprises a plurality of pixel groups, each of the pixel groups comprises at least two pixel assemblies, and the pixel assemblies in a same pixel group are connected to the voltage output end of a same switching circuit.

17. The display device according to claim 11, further comprising:

a timing control circuit, configured to obtain the high-grayscale data or the low-grayscale data of the pixel assembly and to generate a first driving instruction according to the high-grayscale data and generate a second driving instruction according to the low-grayscale data; and a driving circuit, connected to the timing control circuit, wherein the driving circuit receives the first driving instruction or the second driving instruction, and controls, according to the first driving instruction, the switching circuit to output the first voltage, and controls, according to the second driving instruction, the switching circuit to output the second voltage.

* * * * *